United States Patent [19]

Lewis

[11] Patent Number: 5,589,847
[45] Date of Patent: Dec. 31, 1996

[54] SWITCHED CAPACITOR ANALOG CIRCUITS USING POLYSILICON THIN FILM TECHNOLOGY

[75] Inventor: Alan G. Lewis, Sunnyvale, Calif.

[73] Assignee: Xerox Corporation, Stamford, Conn.

[21] Appl. No.: 764,292

[22] Filed: Sep. 23, 1991

[51] Int. Cl.$^6$ ..................................................... G09G 3/36
[52] U.S. Cl. .............................................. 345/98; 345/87
[58] Field of Search ............................. 257/310; 437/20, 437/57, 919; 340/718, 784; 345/98, 100, 87, 92

[56] References Cited

U.S. PATENT DOCUMENTS

| | | | |
|---|---|---|---|
| 3,466,719 | 9/1969 | Sharif et al. | 437/919 X |
| 3,988,824 | 11/1976 | Bodway | 437/919 X |
| 4,169,746 | 10/1979 | Ipri et al. | |
| 4,276,688 | 7/1981 | Hsu | |
| 4,689,116 | 8/1987 | Coissard et al. | |
| 4,694,314 | 9/1987 | Terada et al. | |
| 4,720,467 | 1/1988 | Muggli et al. | 437/919 X |
| 4,772,099 | 9/1988 | Kato et al. | |
| 4,783,146 | 11/1988 | Stephany et al. | |
| 4,814,289 | 3/1989 | Baeuerle | 437/919 X |
| 4,872,002 | 10/1989 | Stewart et al. | |
| 4,878,151 | 10/1989 | Gallichio | |
| 4,918,454 | 4/1990 | Early et al. | |
| 4,988,952 | 1/1991 | Sevastopoulos et al. | |
| 5,042,916 | 8/1991 | Ukai et al. | |

FOREIGN PATENT DOCUMENTS

| | | |
|---|---|---|
| 0145606 | 6/1985 | European Pat. Off. |
| 0263287 | 4/1988 | European Pat. Off. |
| 59-182569 | 10/1984 | Japan |
| 61-13665 | 1/1986 | Japan |
| 2117970 | 10/1983 | United Kingdom |
| 2138207 | 10/1984 | United Kingdom |
| WO86/02489 | 4/1986 | WIPO |

OTHER PUBLICATIONS

Allan, R., "Thin–film Devices on Silicon Chip Withstand up to 500° C", Electronics, vol. 53, No. 1, (1980), pp. 39–40.
Wu, et al., "Retardation of Nucleation Rate for Grain Size Enhancement by Deep Silicon Ion Implantation of Low–Pressure Chemical Vapor Deposited Amorphous Silicon Films", J. Appl. Phys. 65(10) May 1989, pp. 4036–4039.
Lewis et al, IEEE International Solid–State Circuits Conference, pp. 222–223 (Feb. 16, 1990).
Lee et al, IEEE ISSCC Digest, pp. 220–221, (Feb. 16, 1990).
Stewart et al, SID Technical Digest, pp. 319–322 (1990).
Yamauchi et al, IEDM, pp. 353–356 (1989).
Kim et al, SID Technical Digest, pp. 304–306 (1990).
Nakazawa et al, SID Technical Digest, pp. 311–314 (1990).
Ono et al, IEDM, pp. 345–348 (1989).

(List continued on next page.)

Primary Examiner—Ulysses Weldon
Attorney, Agent, or Firm—Oliff & Berridge

[57] ABSTRACT

Switched capacitor analog circuits (such as integrators, amplifiers and digital-to-analog converters) constructed from polysilicon thin film transistors and capacitors are disclosed. The circuits are commonly implemented using conventional single crystal CMOS technologies, but this is the first time they have been realized using polysilicon TFT CMOS. The performance of the circuits is inevitably worse than that of conventional single crystal CMOS devices, but is nevertheless adequate for many large area applications. The circuits can be fabricated on large area substrates and integrated with, for example, flat panel displays, pagewidth optical scan arrays, or pagewidth printheads, offering improvements in the functionality and performance of those devices. Charge redistribution amplifiers and digital-to-analog converters are shown to operate with settling times ranging from a few microseconds to a few tens of microseconds, even with large capacitive loads, despite the relatively poor performance of polysilicon TFTs in comparison to conventional MOSFETS. Better than 8-bit accuracy is also demonstrated for the digital-to-analog converters.

27 Claims, 14 Drawing Sheets

OTHER PUBLICATIONS

Lewis et al, IEDM, pp. 349–352 (1989).
Wu et al, SID Technical Digest, pp. 307–310 (1990).
Matsueda et al, SID Technical Digest, pp. 315–318 (1990).
Lewis et al, IEDM, pp. 261–263 (1988).
Lewis et al, IEDM, pp. 264–267 (1988).
Cho et al, Abstract, "Charge–Sensitive Poly–silicon Amplifiers for A–Si:H Pixel Particle Detectors (1991)".

Borkan, Electronics, pp. 53–60 (Apr. 20, 1964).

Weimer, Proceedings of the IRE, pp. 1462–1469 (Jun. 1962).

Bipolar and Mos Analog Integrated Circuit Designs, Grebene, publisher: John Wiley and Sons, pp. 703–711, 761–764.

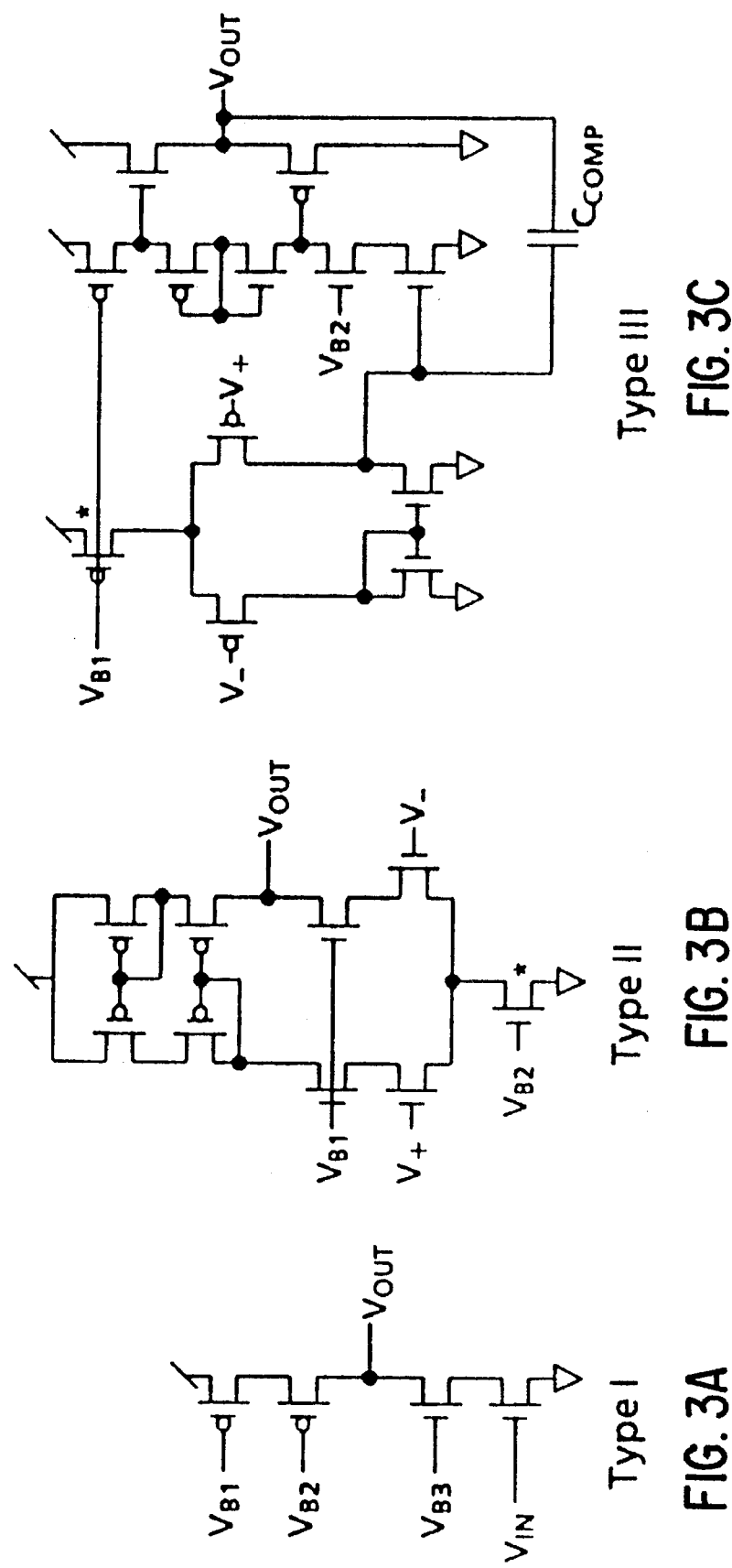

SWITCHED CAPACITOR ANALOG CIRCUITS USING POLYSILICON THIN FILM TECHNOLOGY

BACKGROUND OF THE INVENTION

1. Field of the Invention

The present invention is directed to switched capacitor circuits formed from polysilicon thin film transistors (TFTs) and polysilicon thin film capacitors (TFCs), and in particular to switched capacitor analog circuits such as integrators, amplifiers, and digital-to-analog converters (DACs) using polysilicon TFTs and TFCs which can be used as analog driving circuitry for large area electronic (LAE) devices such as active-matrix liquid crystal displays, pagewidth optical scan arrays, or electrographic or ionographic printheads.

2. Background

Large area electronic devices usually consist of one- or two-dimensional arrays of thin-film circuit elements (often referred to as pixels). These pixels might contain, for example, liquid-crystal light valves for a display, or photodiodes for an optical scan array, or nibs for a print array. In each case the physical size of the array is determined by the application, and is much larger than a conventional silicon integrated circuit. The arrays are therefore built on large area substrates, usually of glass or quartz. The pixel arrays also require driving and interface circuitry, and in most cases this circuitry must be analog rather than digital, that is it must be capable of delivering or sensing a range of input signals. Suitable analog circuitry can be built using well-known switched capacitor techniques in conventional silicon integrated circuits (ICs). These ICs must then be mounted on or adjacent to the large area substrate containing the pixel array, and a large number of electrical connections must be made between the two. The cost of the peripheral drive and interface chips, their mounting and their electrical connection to the large area device can constitute a significant proportion of the overall cost of a system containing a large area device. If the ICs and connections can be eliminated or greatly reduced by integrating suitable circuitry on the large area substrate, then the system cost can be reduced and its reliability improved.

Thus, it is desirable to integrate drive circuitry with the pixel elements on a common substrate (e.g., glass or quartz). A number of circuits have been integrated with LAE displays using polysilicon and amorphous silicon thin film technologies. However, these have been purely digital circuits, or, where analog drive is needed, have used a simple pass transistor to deliver the analog signal to the array with the state of the pass transistor being controlled by digital circuitry.

It has been recognized that polysilicon thin film technology may enable the integration of drive circuitry on a substrate with a pixel array. However, due to the inferior performance of polysilicon thin film transistors (TFTs) when compared with conventional single crystal silicon MOS field effect transistors (MOSFETs), it has been thought that the fabrication of true analog circuits using polysilicon thin film technologies is not possible.

Polysilicon TFTs are inferior to conventional silicon MOSFETs in several ways. First, the electrical drive current available from a polysilicon TFT is much lower than that of a similar-sized MOSFET. This limitation also applies to digital circuits, but is more severe under the bias conditions typically employed in analog amplifiers. Second, the saturation characteristics of polysilicon TFTs are poor, with a low output impedance caused by the so-called "kink" effect which arises from channel avalanche multiplication and which is made worse by the presence of trap states in the device channel. This low output impedance is much more important for analog circuits than digital since it can limit the voltage gain available from an amplifier. Third, polysilicon TFTs are known to suffer from relatively high off-state leakage currents compared with MOSFETs. In analog applications, it is often necessary to store charge on a capacitor, and any charge lost due to TFT leakage will cause an error in the analog signal. Digital circuits, on the other hand, are much less susceptible to leakage; even in a dynamic design, where charge is also stored on a capacitive node, the total charge loss must exceed some threshold value before any signal error will arise, and this threshold is normally much larger than the acceptable charge loss in an analog circuit. Fourth, polysilicon TFTs exhibit much higher electrical noise then MOSFETs, a problem which is again much more important in analog applications than digital.

Single crystal thin-film technologies, also referred to as silicon-on-insulator technologies, such as silicon-on-saphire (SOS), separation by implanted oxygen (SIMOX) or zone-melt recrystallization (ZMR), also suffer some of the limitations discussed above, notably the kink effect (although it is not so severe in single crystal SOI MOSFETs as in polysilicon TFTs) and increased leakage. These technologies are not commonly used for analog applications, in part for these reasons.

A number of references recognize that it would be desirable to use TFTs to form integrated drivers for LAE devices such as liquid crystal displays. These references disclose polysilicon treatments which improve some of the characteristics of TFTs, however, even the improved polysilicon TFTs do not approach single crystal transistors in operating characteristics. Moreover, none of these references disclose switched capacitor analog circuits constructed using polysilicon thin film technology.

Alan G. Lewis and Richard Bruce, in "Circuit Design and Performance for Large Area Electronics", 1990 IEEE International Solid-State Circuits Conference, pp. 222–223, Feb. 16, 1990, discuss the use of polysilicon TFTs to form operational amplifiers (see FIG. 4). The use of cascodes (two or more transistors in series with separated gates) is disclosed in order to compensate for the kink effect in polysilicon TFTs. In spite of the low performance of polysilicon TFTs (low drive currents, higher threshold voltages), digital shift registers were fabricated which operate at high speeds (30 MHz). This is believed to be due to the low parasitic capacitance between the TFTs and the insulator substrate. Additionally, an operational amplifier constructed entirely from polysilicon TFTs is disclosed. This op-amp minimizes drain biases on the n-channel TFTs which are most susceptible to the degradation of output impedance due to the kink effect, and a complementary source-follower output stage is used to overcome the limited drive current. However, switched capacitor circuits were not demonstrated, and issues such as TFT leakage, compensation of the amplifier required for switched capacitor applications, and the linearity of thin film capacitors were not discussed.

S. N. Lee et al, in "A 5×9 inch Polysilicon Gray-Scale Color Head Down Display Chip", 1990 IEEE Solid-State Circuits Conference, pp. 220–221, Feb. 16, 1990, and R. G. Stewart et al in "A 9V Polysilicon LCD with Integrated Gray-Scale Drivers", pp. 319–322, SID 90 Digest, disclose a driver circuit for an LCD display which receives a digital input and an analog ramp-voltage input to produce an analog output to control the gray scale of the LCDs. All the polysilicon circuitry is digital; the bulk of it controls the time during which a pass transistor is held in the conducting state, and hence how much of the externally generated ramp is delivered to a given data line.

N. Yamauchi et al in "Drastically Improved Performance in Poly-Si TFTs With Channel Dimensions Comparable to Grain Size", IEDM, pp. 353-356, 1989, discloses processes for forming polysilicon TFTs which improve their field-effect mobility and current leakage.

D. M. Kim et al, in "Characterization and Modeling of Polysilicon TFTs and TFT-CMOS Circuits for Display and Integrated Driver Applications", SID Digest, pp. 304-306, 1990 disclose digital flip-flops, level shifter devices and buffer devices constructed from polysilicon TFTs.

K. Nakazawa et al in "Lightly Doped Drain TFT Structure for Poly-SiLCDs", SID Digest, pp. 311-314, 1990, discusses the promise of forming on-glass peripheral circuits made from polysilicon TFTs on full-color flat-panel liquid crystal displays. However, the low field-effect mobility and high current leakage are recognized as problems which still need to be overcome.

K. Ono et al in "Polysilicon TFTs With Low Gate Line Resistance and Low Off-State Current Suitable for Large Area and High Resolution LCDs", IEDM Digest, pp. 345-348, 1989, disclose polysilicon TFTs having lower gate line resistances and lower off-state currents by reacting Pt with gate polysilicon films.

Alan G. Lewis et al in "Physical Mechanisms for Short Channel Effects in Polysilicon Thin Film Transistors", IEDM Digest, 349-352, 1989, discuss the physical mechanisms responsible for short-channel threshold shifts in n- and p-channel polysilicon thin film transistors.

Japanese Patent Publication No. 59-182569 to Kumada discloses a thin film transistor having improved output characteristics by inactivating the surface of the thin film source and drain electrodes through heat treatment in a mixed gas containing hydrogen when the transistor is formed on an insulating substrate.

Wu et al in "Performance of Polysilicon TFT Digital Circuits Fabricated With Various Processing Techniques and Device Architectures", SID Digest, pp. 307-310, 1990, discuss fabrication processes for improving polysilicon TFTs, as well as digital driver circuits for LAE devices formed from these polysilicon TFTs.

Y. Matsueda et al in "New Technologies for Compact TFT LCDs With High-Aperture Ratio", SID Digest, pp. 315-318, 1990 disclose an LCD matrix wherein one storage capacitor line is provided for every two scanning lines.

Additional references which disclose TFTs used in digital circuits for LAE devices include U.S. Pat. No. 4,872,002 to Stewart et al, U.K. Patent Application No. 2,117,970 to Oshima et al, and Japanese Patent Publication No. 61-13665 to Hiranaka.

U.S. Pat. No. 4,872,002 to Stewart et al describes switched capacitor load circuits used in an integrated digital display driver. These load circuits are used to simulate a resistive load for TFT latches, and allow the gain of the latch to be modified. This load circuit does not include an amplifier, and is more simple than the circuits of the present invention, both in consisting of fewer elements, and in what it achieves. More complex circuits are not suggested. Stewart et al also note that their switched capacitor circuits deviate from ideal behavior (a feature of all switched capacitor circuits which limits their usefulness). It was expected that the analog circuits constructed according to the present invention would be fairly poor because of this characteristic of polysilicon switched capacitor circuits. However, surprisingly, they performed much better than expected.

U.K. Patent Application No. 2,117,270 to Oshima et al discloses digital circuits constructed from polysilicon TFTs.

The abstract "Charge-Sensitive Poly-Silicon Amplifiers For A-Si Pixel Particle Detectors", by Cho et al states that charge-sensitive poly-silicon TFT amplifiers have been made, but no details are given.

U.S. Pat. No. 4,783,146 to Stephany et al disclose TFTs used as switches in a liquid crystal print bar.

U.S. Pat. No. 4,772,099 to Kato et al discloses the use of polysilicon TFTs as switches in liquid crystal displays.

Additional background material relating to TFTs include "Depositing Active And Passive Thin-Film Elements On One Chip" by Harold Borkan, Electronics, Apr. 20, 1964 and "The TFT-A New Thin-Film Transistor" by Paul K. Weimer, Proceedings of the IRF, 1962.

The above references are incorporated herein by reference for purposes of background material regarding digital and analog driver circuitry.

While many of these references recognize the desirability of forming driver or interface circuitry from polysilicon TFTs because such circuitry can be integrated on the large area substrates which currently contain the arrays of LC light valves, photodiodes or print nibs, none of these references disclose the present invention. Many of the references seek to improve the performance of polysilicon so that TFTs function more like single crystal devices. Other references form digital circuits from polysilicon TFTs. However, none of the references disclose true analog circuits made from polysilicon, and in fact, the skilled artisan would not expect such circuits to achieve useful performance due to the limited performance of polysilicon TFTs discussed above.

OBJECTS AND SUMMARY OF THE INVENTION

It is an object of the present invention to provide analog switched capacitor circuits which can be fabricated on large area insulating substrates, such as quartz or glass, from polysilicon.

It is another object of the present invention to fabricate analog switched capacitor drive and interface circuits suitable for integration with other circuit elements in large area electronic devices.

To achieve the foregoing and other objects, and to overcome the shortcomings discussed above, switched capacitor circuits are fabricated using polysilicon TFTs and TFCs. While switched capacitor circuits, as well as TFTs and TFCs are well known, it was not previously believed that TFTs and TFCs could be used to fabricate analog switched capacitor circuits due to the poor performance of polysilicon TFTs (versus single crystal silicon MOSFETs). However, surprisingly, it has been found that analog switched capacitor circuits fabricated using TFTs and TFCs are accurate enough for use as analog control circuitry in LAE devices. Moreover, since TFTs and TFCs can be formed on glass substrates, they can be integrated with the pixel elements (which are already being formed on the substrates using thin film technology). Accordingly, LAEs can be fabricated having a reduced number of, or no, peripheral driver chips, reducing chip-to-substrate connections, so as to reduce overall cost and improve reliability.

Switched capacitor amplifiers, charge redistribution digital-to-analog converters, and sampling amplifiers are disclosed, and have been built, which exhibit performance characteristics suitable for driving LAE devices such as LCDs, pagewidth image sensors, and pagewidth electrographic or ionographic printheads.

BRIEF DESCRIPTION OF THE DRAWINGS

The invention will be described in detail with reference to the following drawings in which like reference numerals refer to like elements and wherein:

FIGS. 3A–3C are three polysilicon TFT operational amplifiers used to form switched capacitor circuits;

DETAILED DESCRIPTION OF THE PREFERRED EMBODIMENTS

The present invention is particularly applicable to forming analog interface and driving circuitry for LAE devices which can be integrated on the same substrate as the circuit elements with which they are associated. For example, the analog switched capacitor circuits of the present invention can be used to form data drivers, including sampling amplifiers and digital-to-analog converters for active matrix LCDs (AMLCDS).

While some specific circuits constructed from polysilicon TFTs and TFCs are shown, these circuits are merely illustrative. The present invention involves the discovery that analog switched capacitor circuits made from polysilicon can be constructed which have operating characteristics appropriate for use as data drivers and interface circuits for LAE devices.

Figure 1:
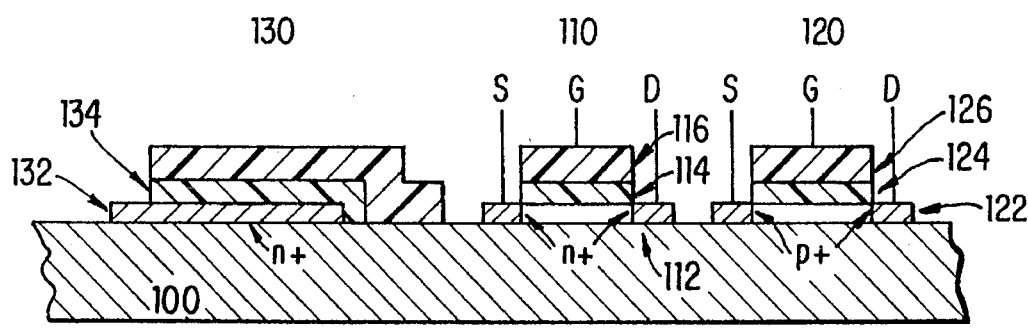
FIG. 1 is a cross section of n- and p-channel polysilicon TFTs and a polysilicon TFC formed on a common insulator substrate.

As described above, polysilicon TFTs are commonly used to form switches and digital circuits integrally on a substrate with LCDs. See the above incorporated U.S. Pat. Nos. 4,872,002, 4,772,099, and 4,783,146. Polysilicon thin film technology is also well suited for the integration of capacitors. FIG. 1 shows cross sections of n- and p-channel TFTs 110, 120, respectively, and a capacitor 130 built on the same insulating quartz or glass substrate 100. Each TFT includes active polysilicon islands 112 and 122, a gate oxide layer 114, 124, and a polysilicon gate 116, 126. The capacitor requires only one additional implant to make a conducting bottom plate 132 out of the active device island, and uses the TFT gate dielectric 134. In layout, the capacitor is similar to a polysilicon to diffusion capacitor in a conventional MOS analog process. However, in a thin film technology, this structure has the important advantage of negligible parasitic capacitance associated with either plate due to its formation on insulating substrate 100.

Figure 2A:
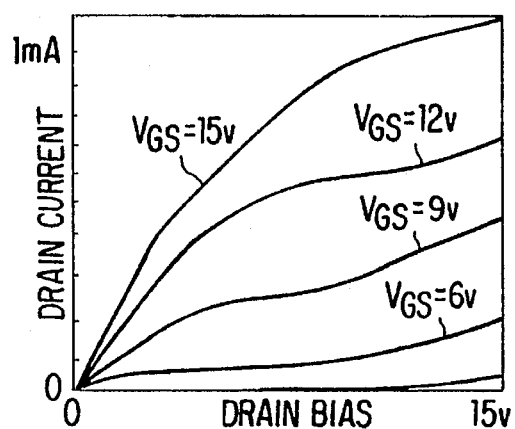
FIGS. 2A and 2B show typical characteristics for n- and p-type polysilicon TFTs and illustrate the low current drives, high threshold voltages and kink effect.
Figure 2B:
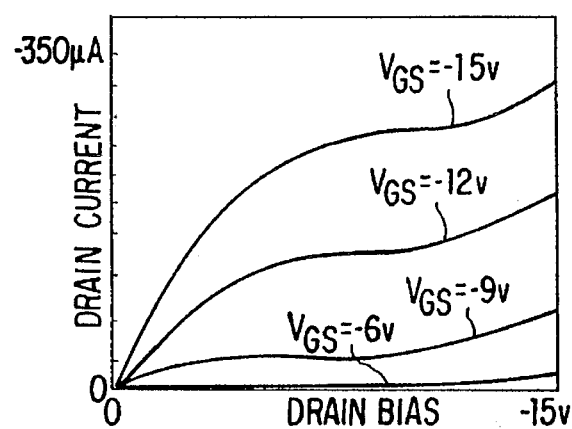

FIG. 2 shows typical characteristics for n- and p-channel TFTs, each having a width (W) of 50 μm and a length (L) of 10 μm. Drain current is shown as a function of drain-source bias for various values of gate-source bias. The drive currents are about an order of magnitude lower than for single crystal devices, as noted above, and the threshold voltages are higher. The saturation characteristics also display the kink effect described above. The low drive current and poor saturation characteristics both suggest that these devices are not suitable for analog circuit design, as discussed above.

FIGS. 3A–C show schematics for three operational amplifiers which were formed entirely using polysilicon thin film technology. The circuits have all been fabricated using polysilicon thin-film transistors and employ design rules compatible with large area processing on 32 cm×34 cm plates (i.e., minimum feature size is 10 μm). The simple amplifier (type I in FIG. 3A) uses cascodes to overcome the poor output impedance of the TFTs in saturation due to the kink effect. See, for example, the above-incorporated paper by Lewis and Bruce entitled "Circuit Design and Performance for Large Area Electronics", 1990 IEEE International Solid-State Circuits Conference, pp. 222–223 (Feb. 16, 1990). This circuit used the minimum number of TFTs, and is important since in most applications the area available for the circuits is limited. The type II (FIG. 3B) circuit provides a differential input and retains the cascode. The type III circuit (FIG. 3C) uses two stages for increased gain and a complementary source follower output stage for increased drive; it does, however, require compensation (by capacitor $C_{COMP}$) to ensure stability.

Figure 4:
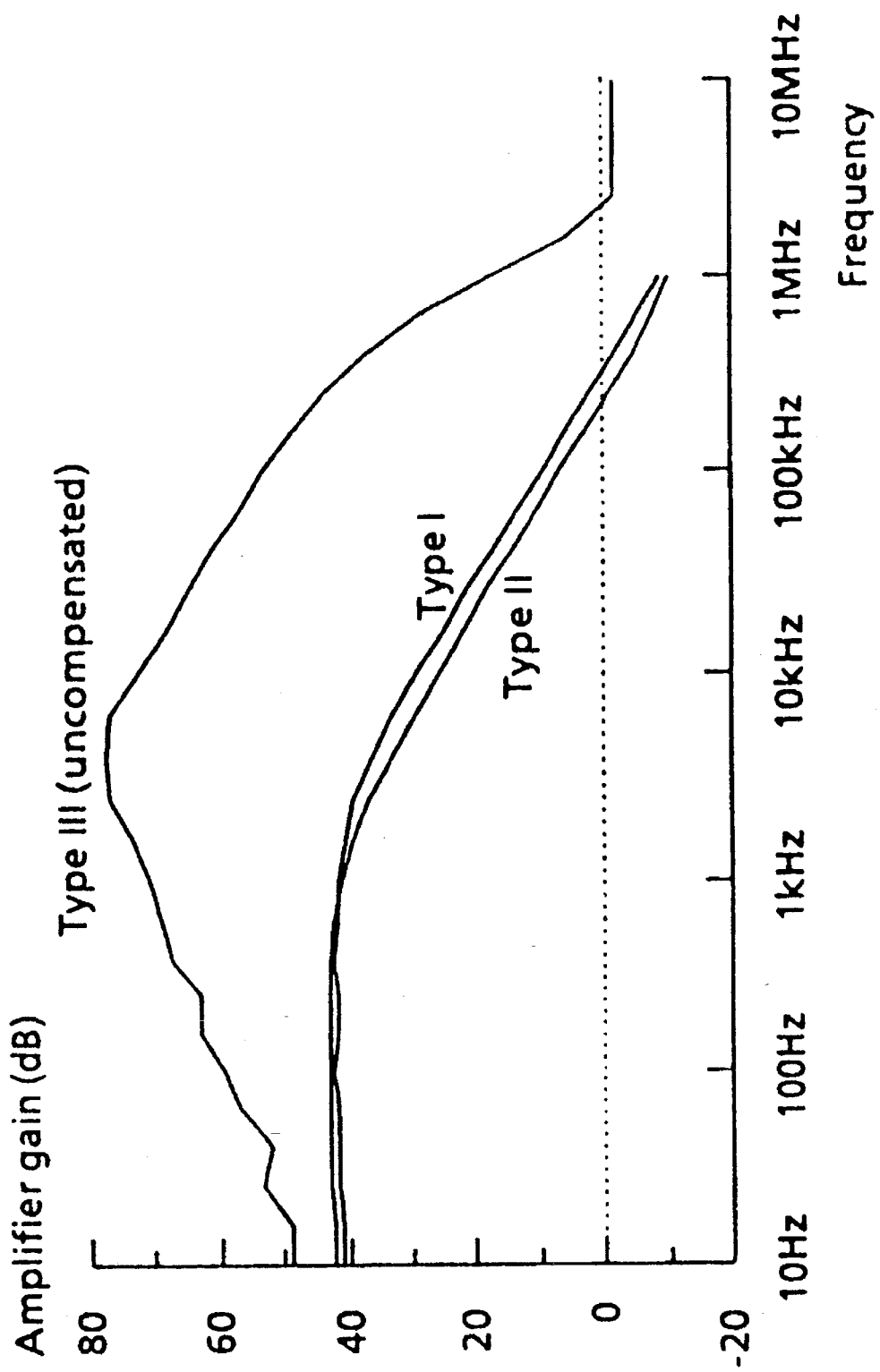
FIG. 4 shows the frequency response for the FIG. 3A–C operational amplifiers.

FIG. 4 shows the frequency response of each amplifier when driving a 30 pF load capacitance. Amplifier gain (dB) is shown as a function of frequency. Each TFT had geometric characteristics of L=10 μm and W=200 μm, (except * in the Type II and Type III amplifiers, for which W=400 μm). $V_{DD}$=20V, and the bias current was 100 nA/μm width. The high low-frequency gain of the two stage design is clear, along with its improved bandwidth.

Figure 5:
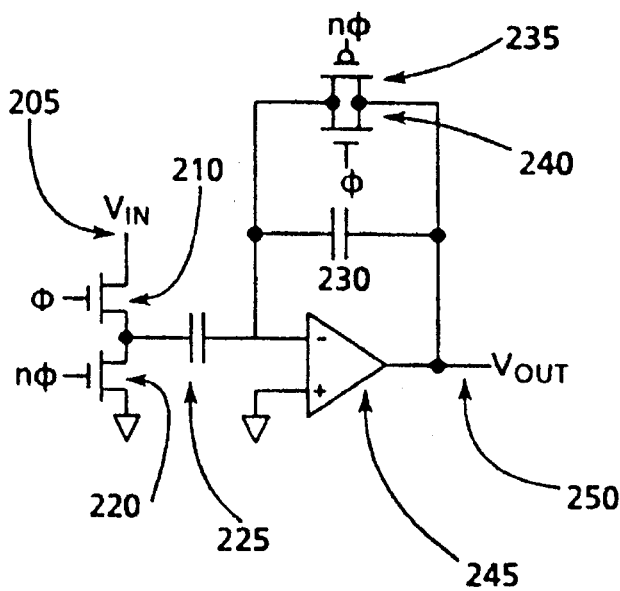
FIG. 5 is one embodiment of a switched capacitor amplifier constructed from polysilicon TFTs and TFCs.

FIG. 5 shows the schematic of a switched capacitor amplifier 200 fabricated using the thin film polysilicon technology. The switched capacitor circuits of the present invention are standard circuits, although they have not been implemented previously in polysilicon thin film technology. For a general understanding of switched capacitor circuits, see Bipolar and MOS Analog Integrated Circuit Design, by Alan B. Grebene, John Wiley & Sons, pages 703–711, the disclosure of which is incorporated herein by reference.

Although the switched capacitor amplifier 200 of FIG. 5 is of straightforward design, a brief description is provided. The switched capacitor amplifier functions to provide an output voltage $V_{OUT}$ at terminal 250 which is proportional to the input voltage $V_{IN}$ supplied to terminal 205. The gain is controlled by the ratio of the capacitances of input capacitor 225 and feedback capacitor 230. In one example, the capacitance of capacitor 225 was 35 pF, while feedback capacitor 230 had a capacitance value of 3.5 pF. Digital clock signals φ and nφ (nφ being the inverse of φ), are applied to transistor switches 210, 220, 235 and 240 so that the output of circuit 200 is set by the transfer and distribution of charge among input capacitor 225 and feedback capacitor 230 under the control of the transistor switches. Transistor 235 is a p-channel TFT and conducts when a low clock signal is applied to its gate, while transistors 210, 220 and 240 are n-channel TFTs and conduct when a high clock signal is applied to their gates.

In order to understand the operation of this circuit, suppose first that clock signal φ is high (and nφ low). This is the reset condition; TFTs 235 and 240 are both conducting so that feedback capacitor 230 is discharged and the output node 250 is at ground (0v). At the same time, TFT 210 is conducting and TFT 220 is non-conducting, so the left hand plate of the input capacitor 225 is at the potential of the input node 205, $V_{IN}$, which is assumed to be positive here. The right hand plate of capacitor 225 is connected to the operational amplifier 245 inverting input which acts as a virtual ground and so is at 0v. Thus, the input capacitor 225 has a voltage equal to the input voltage $V_{IN}$ across it. The amplification phase of the cycle is initiated when φ goes low (and nφ goes high). The reset TFTs 235 and 240 then become non-conducting, and the feedback capacitor 230 is free to become charged. At the same time, TFT 210 becomes nonconducting, isolating the left hand plate of input capacitor 225 from the input node 205, and TFT 220 becomes conducting, connecting the left hand plate of input capacitor 225 to ground. The inverting input of the operational amplifier 245 is thus driven towards a negative voltage, causing the output node 250 to swing to a positive voltage. Current flows via the feedback capacitor 230 to the operational amplifier inverting input, and this current discharges input capacitor 225. The result is a transfer of electrical charge from the input capacitor 225 to the feedback capacitor 230. This continues until only a small residual charge is left on the input capacitor 225 and the feedback capacitor 230 holds almost all the charge originally present on the input capacitor. The output voltage present at node 250 is then given by:

$$V_{OUT} = V_{IN} \cdot \frac{C_{IN}}{C_{FB}} \cdot \left( \frac{A}{1+A} \right)$$

where $V_{OUT}$ is the final voltage at node 250, $V_{IN}$ is the voltage at node 205 at the time when φ goes low, $C_{IN}$ is the capacitance of the input capacitor 225, $C_{FB}$ is the capacitance of the feedback capacitor 230, and A is the voltage gain of the operational amplifier 245. Normally the amplifier gain A is very high, so the output voltage is close to being the input voltage scaled by the ratio of the input and feedback capacitors.

Once the output voltage has settled and been used (for example by being transferred from a data line into the selected pixel in an active matrix liquid crystal display), the clock signal φ goes high again (and nφ low), resetting the amplifier ready to sample the next input voltage.

Figure 6:
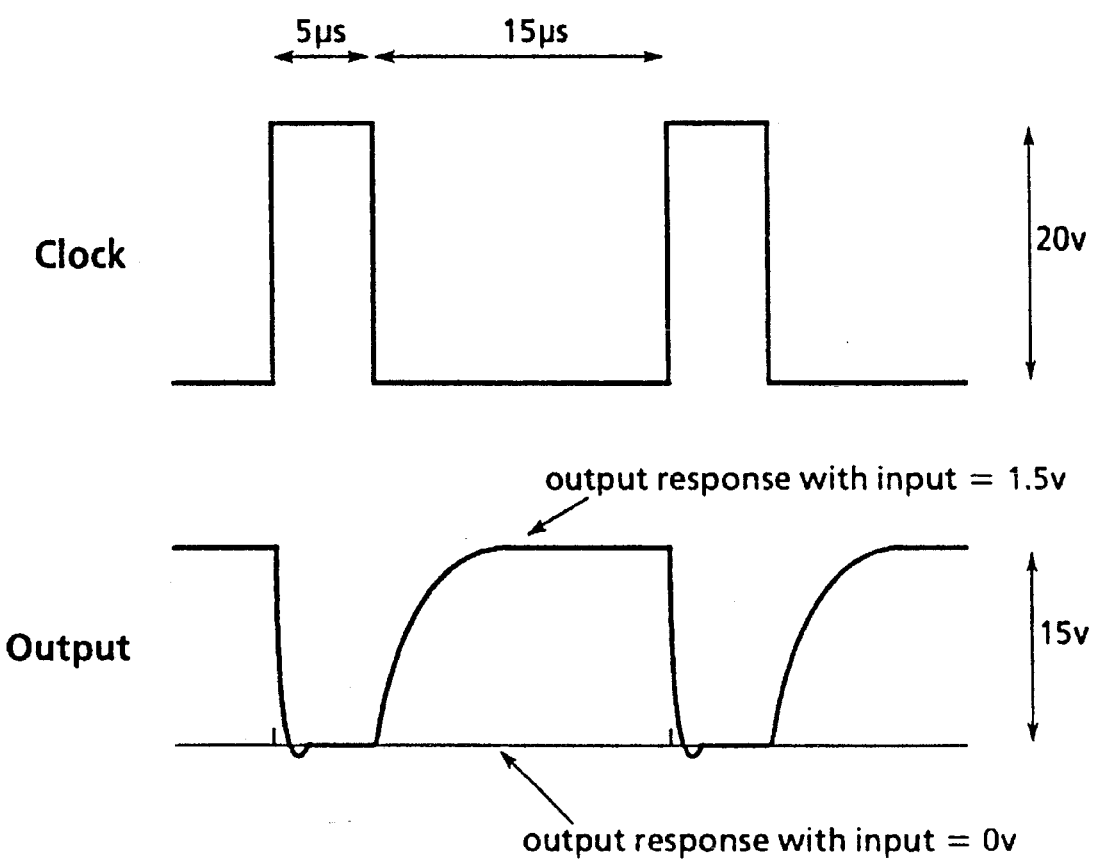
FIG. 6 shows waveforms produced by a switched capacitor amplifier constructed from the FIG. 3A op amp.
Figure 7:
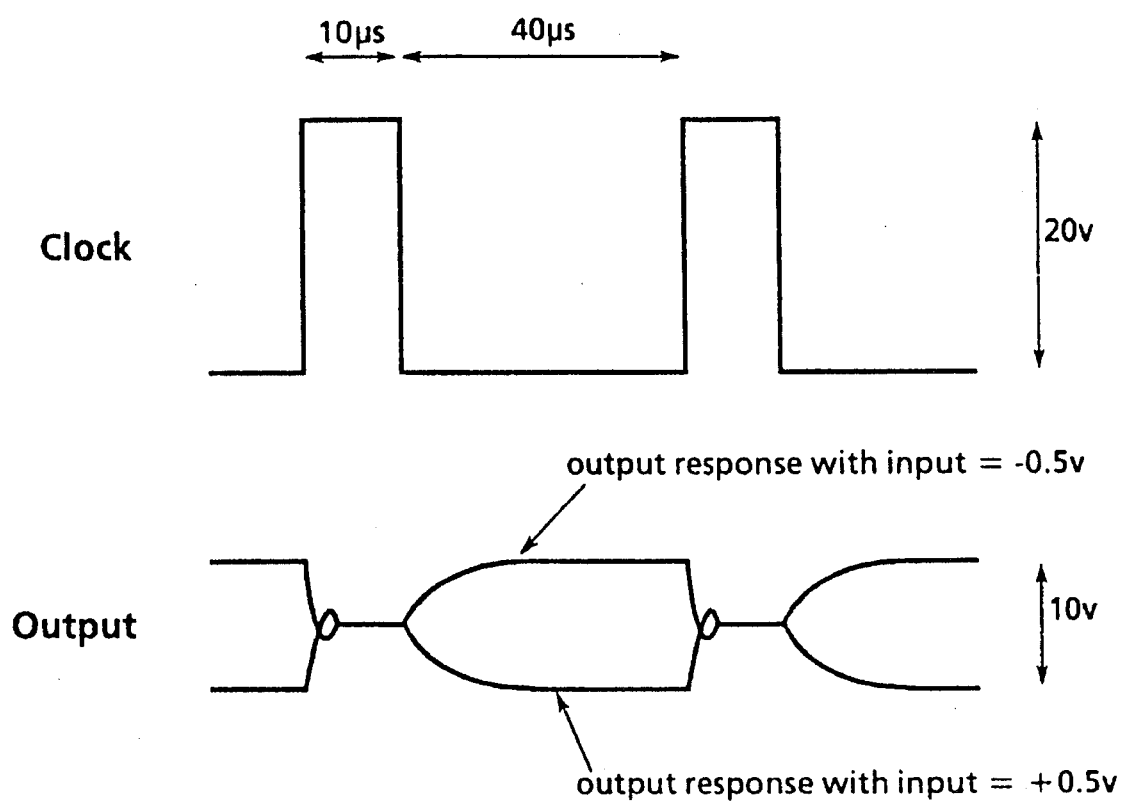
FIG. 7 shows waveforms produced by a switched capacitor amplifier constructed from the FIG. 3C op amp.

FIGS. 6 and 7 show clock (φ) (upper trace) and output (lower trace) waveforms for the switched capacitor amplifier of FIG. 5 implemented with type I and type III operational amplifiers respectively. The two phases of reset (with the clock signal high) and amplification (with the clock signal low) can be seen. In FIG. 6 output waveforms are shown for fixed input voltages of 1.5 and 0v, while in FIG. 7 the input voltages are +0.5v and −0.5v. The load capacitance was 30 pF for the circuit using a type I operational amplifier (FIG. 3a), but with the type III amplifier (FIG. 3c) a much higher load capacitance of 250 pF could be used without degrading the output settling too severely. This emphasizes the higher drive available from the type III operational amplifier. In both the circuits used to obtain FIGS. 6 and 7, the TFT lengths were all 10 μm, and the bias current was 100 nA/pm width for the amplifier TFTs, and both the supply voltage and clock pulse peak-peak amplitude were 20v.

The line time available for a conventional TV resolution active matrix liquid crystal display is about 60μs. FIGS. 6 and 7 show that the switched capacitor amplifiers are able to settle with cycle times well below this, even with large capacitive loads. The output swings are also suitable for liquid crystal displays. Thus an array of such amplifiers could be used to provide the parallel drive needed for the data lines of an active matrix display.

Figure 8:
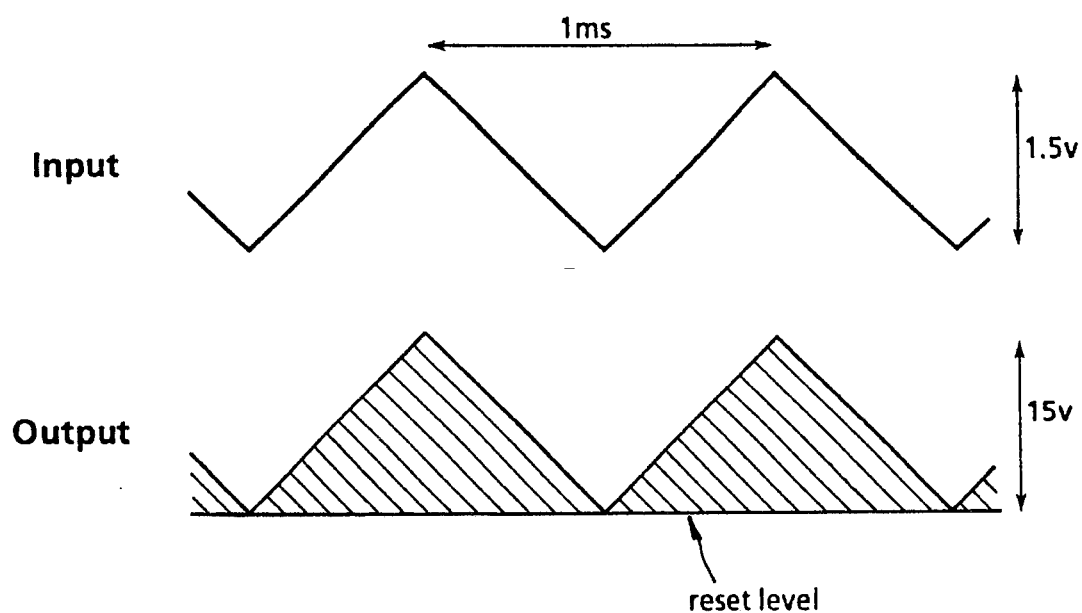
FIG. 8 shows waveforms produced by a switched capacitor amplifier constructed from the FIG. 3A op amp driven at a clock frequency of 50 kHz with a 1 kHz triangular wave input.
Figure 9:
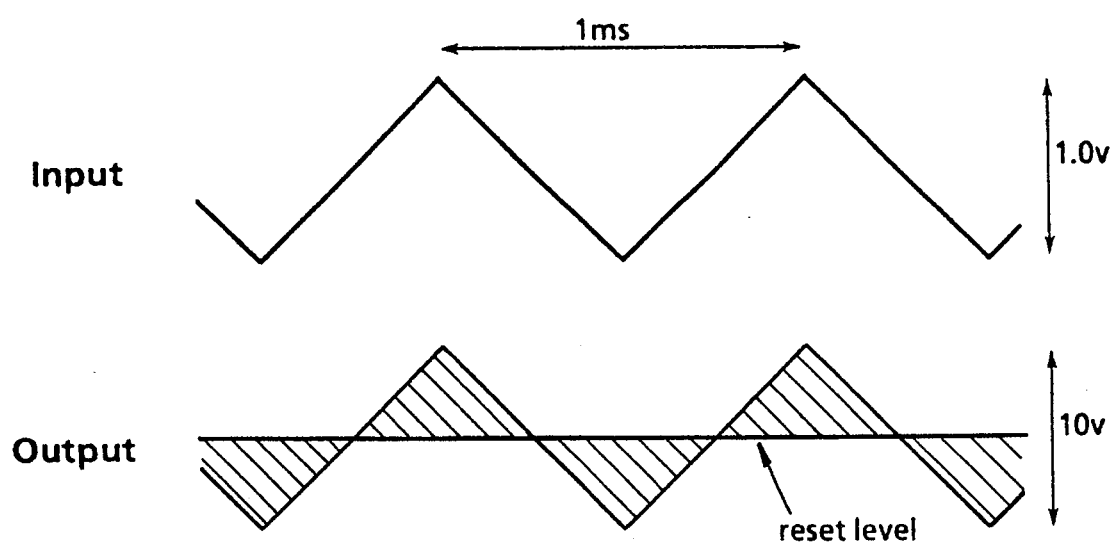
FIG. 9 shows a waveform produced by a switched capacitor amplifier constructed from the FIG. 3C op amp driven at a clock frequency of 20 kHz with a triangular wave input similar to that in FIG. 8.

FIGS. 8 and 9 show the response of the amplifiers to 1 kHz triangle wave inputs. The top trace is of the input signal, while the lower trace is of the output. The clock frequency used with the type I circuit was 50 kHz, while a clock frequency of 20 kHz was used for the type III circuit. Good linearity and the absence of clipping can be seen.

It should also be noted that a switched capacitor integrator is provided by op amp 245, capacitor 230 and reset TFTs 235 and 240 of the FIG. 5 circuit. The output of the switched capacitor integrator is set by the accummulation of charge on capacitor 230 under the control of transistors 235 and 240, and op amp 245.

Another useful but more complex circuit for AMLCD data driving or other LAE applications is an on-glass digital-to-analog converter. The present invention permits the construction of all thin-film charge redistribution DACs. The basic circuit of a demonstration charge redistribution DAC 255 is shown in FIG. 10, and again circuits using the different amplifiers shown in FIGS. 3A–C have been fabricated. The DAC of FIG. 10 receives 4 bits of input data to produce a variable output voltage based on the input. Operation of the DAC is somewhat similar to the operation of the switched capacitor amplifier discussed above. However, instead of a single input capacitor, a plurality of input capacitors are used.

During the reset phase, the clock signal φ is high and the feedback capacitor 230 is discharged. The right hand plates of the input capacitors 225a–d are all held at virtual ground, but the left hand plates are either held at the reference voltage $V_{REF}$ or at ground depending on the state of the corresponding input bit. If the input bit is 1 (high) then the appropriate circuit 260a–d connects the left hand plate to $V_{REF}$ and the input capacitor is charged to $V_{REF}$, but if the input bit is 0 (low) then the left hand plate is held at ground and the input capacitor remains uncharged. During the amplification phase, when the clock signal φ is low, the charge is transferred from the input capacitors 225a–d to the feedback capacitor 230 as discussed above for the simple switched capacitor amplifier. The total charge transferred to feedback capacitor 230 thus depends on the sizes of the input capacitors 225a–d and the digital input word. In order to obtain the correct DAC operation, the input capacitors must ascend in binary sequence; in this example, $225a=C_O$, $225b=2C_O$, $225c=4C_O$, $225d=8C_O$ and the feedback capacitor $230=16C_O$, where $C_O$ is 1 pF. (In practice, the capacitors are made up of parallel combinations of either 1, 2, 4, 8 or 16 identical unit capacitors respectively in order to eliminate errors due to edge effects, process variation and so on).

Figure 10:
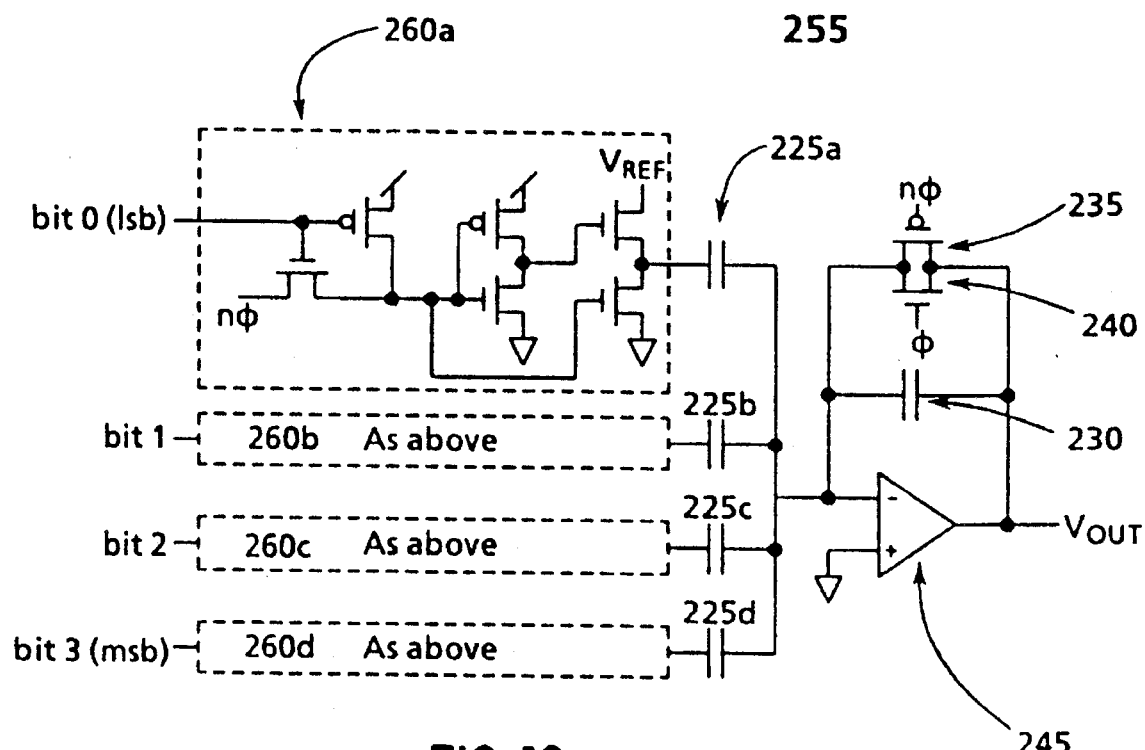
FIG. 10 is one embodiment of a charge redistribution digital-to-analog converter constructed from polysilicon TFTs and TFCs.
Figure 11:
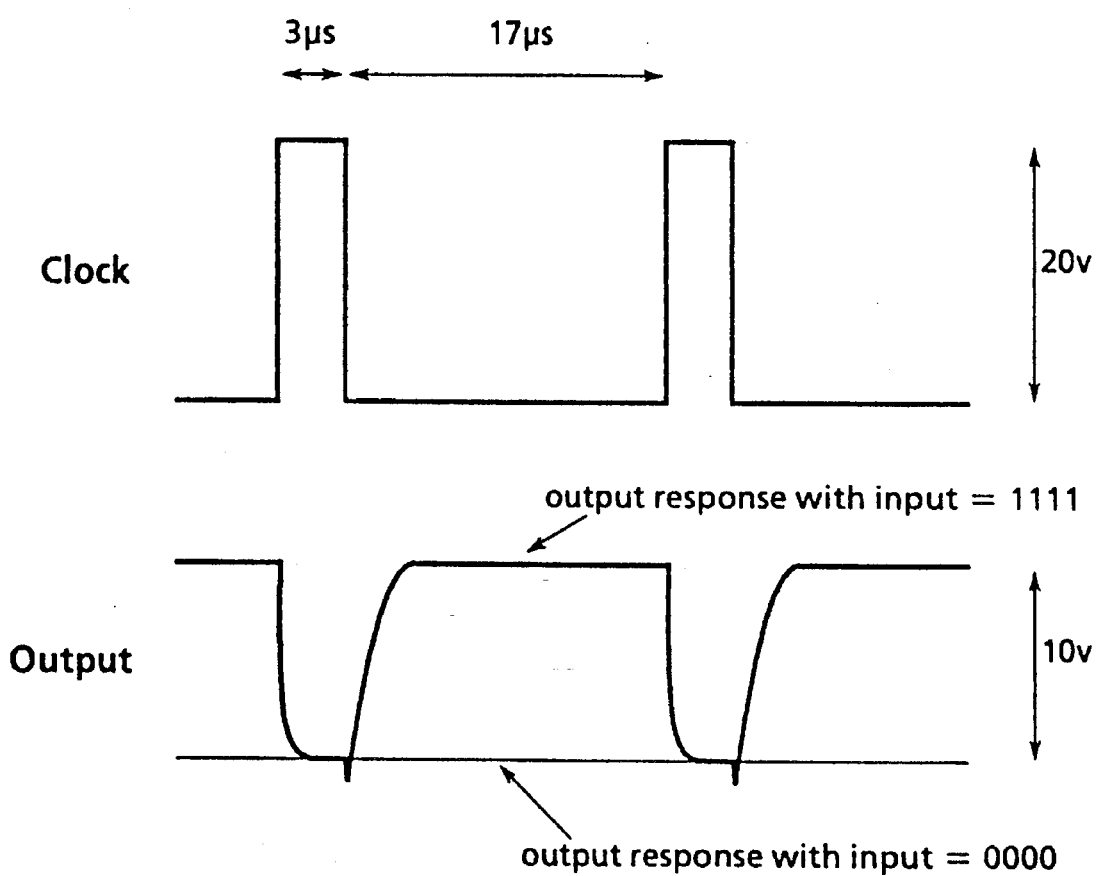
FIG. 11 is a waveform produced by the FIG. 10 charge redistribution digital-to-analog converter.

FIG. 11 shows the clock (upper trace) and output (lower trace) waveforms for the DAC of FIG. 10 fabricated using the type I operational amplifier (FIG. 3a). In this example, the circuit is operating at 50 kHz conversion rate, although the settling time is short enough to allow faster operation. Other circuit parameters are the same as for the circuits tested in FIGS. 6 and 7. Output signals are shown for input codes of 0000 and 1111; any binary input between these values produces an intermediate output.

Figure 12:
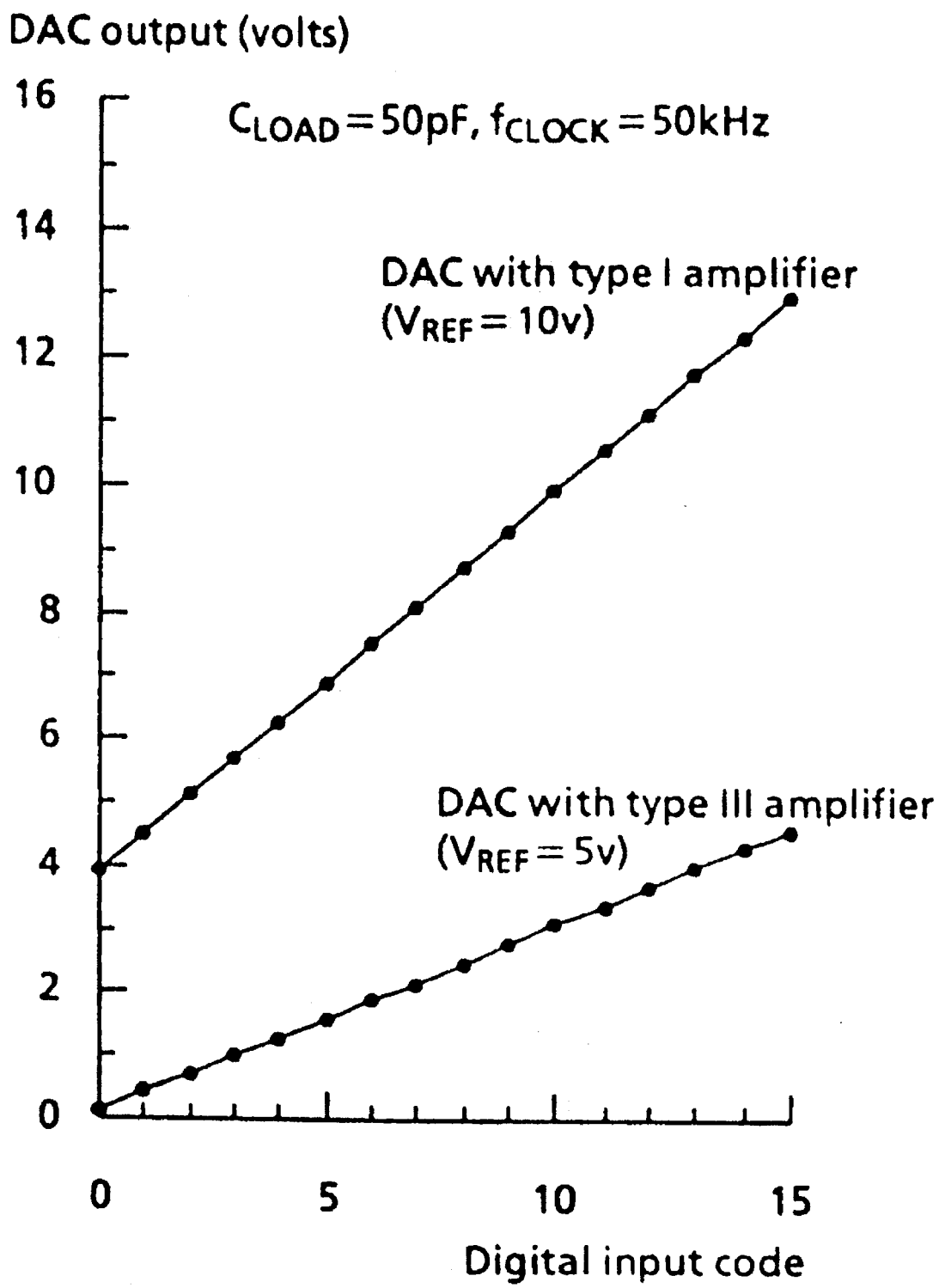
FIG. 12 shows the response for DACs constructed from the type I and type III amplifiers.
Figures 13A, 13B:
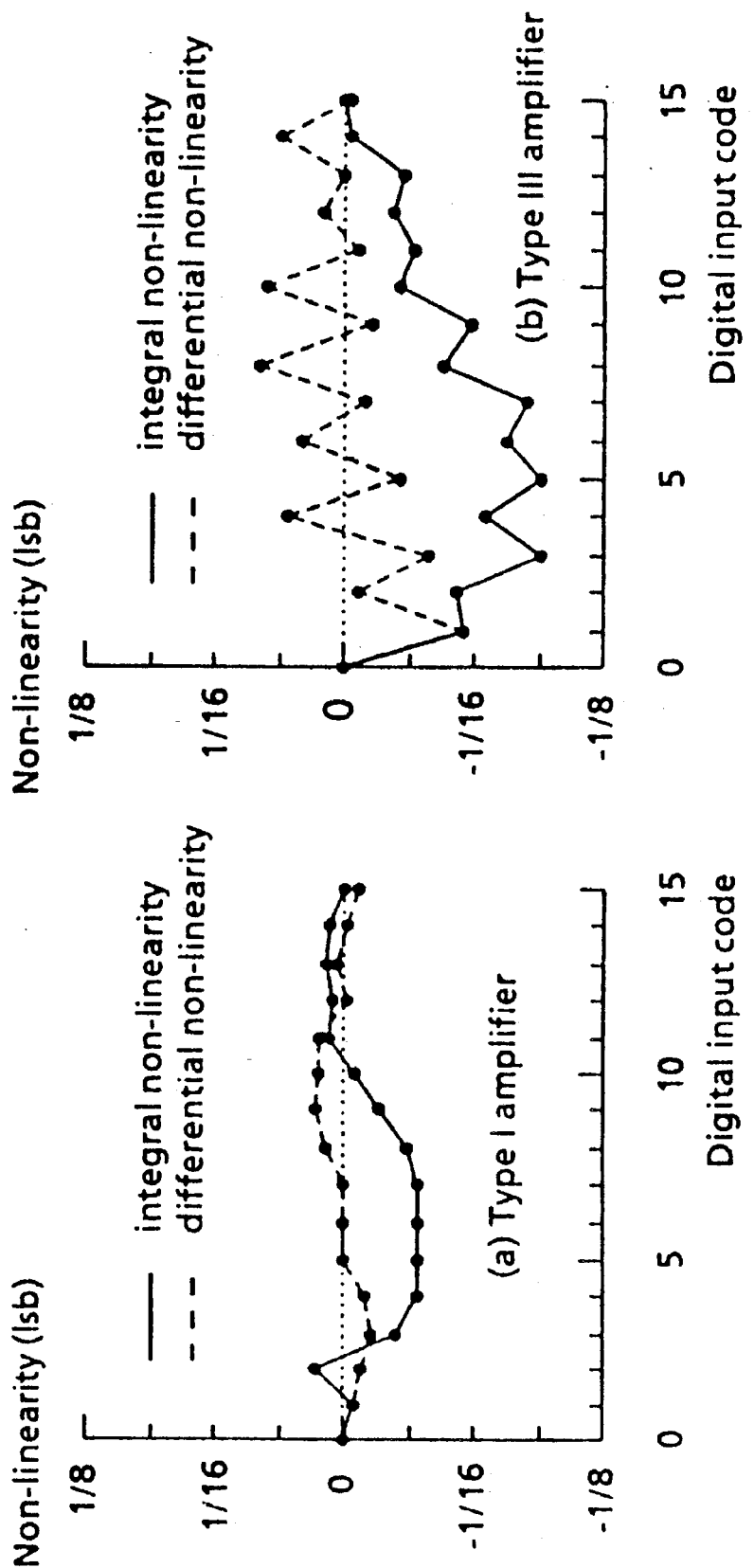
FIGS. 13A and 13B show the converter error for DACs constructed from the type I and type III amplifiers, respectively.

FIG. 12 shows the output voltage just before reset as a function of the digital input code for DACs built using the type I (FIG. 3a) and type III (FIG. 3c) operational amplifiers. FIGS. 13a and 13b show the differential and integral non-linearity obtained from the curves shown in FIG. 12. Although 4-bit DACs were built for demonstration purposes, their precision is better than $\frac{1}{16}$th lsb, that is the circuit accuracy obtained with this example configuration is adequate for an 8-bit DAC.

The input switching circuits 260a–d are shown for the sake of example. Other circuits for achieving the same function will be apparent to those skilled in the art.

In view of the poor performance of polysilicon TFTs in comparison with conventional MOSFETs normally used to implement switched capacitor circuits, and particularly since their performance limitations (low drive, poor saturation, leakage and noise) are likely to have a greater impact on analog circuits than digital as discussed above, it is surprising that switched capacitor circuits with the useful levels of performance described above can be built using these devices.

Switched capacitor circuits built entirely using polysilicon thin film devices on quartz substrates have been demonstrated for the first time according to the present invention. Charge redistribution amplifiers and digital-to-analog converters are shown to operate at clock rates of above 50 kHz despite the relatively poor performance of polysilicon TFTs in comparison to conventional MOSFETs. Better than 8-bit accuracy is demonstrated for the DACs. These results offer the possibility of greatly increased functionality on large area devices such as flat-panel displays, pagewidth scan arrays or pagewidth printheads.

Figure 14A:
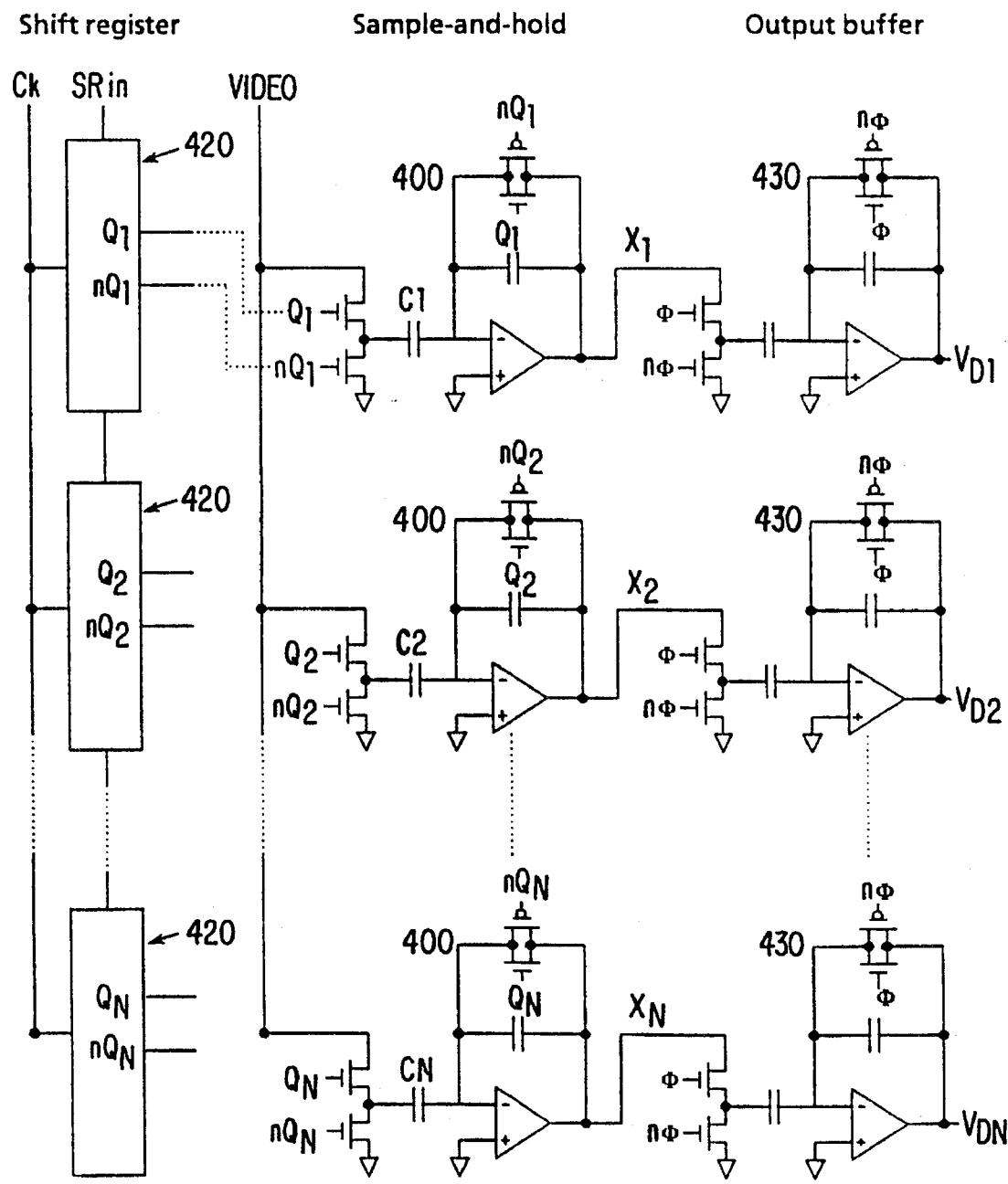
FIG. 14A illustrates a video signal sample-and-hold circuit (sampling amplifier) for display driving.

One way in which this can be achieved is illustrated in FIG. 14A. This shows an array of video sampling amplifiers which might be used to drive the data lines of an AMLCD. Circuits such as this are currently implemented using single crystal technologies, but have not been reported in polysilicon thin film technology. The circuit uses two sampling amplifiers similar to the circuit shown in FIG. 5 for every output. The first amplifier, 400, samples the input video signal and is controlled by a conventional prior art polysilicon TFT shift register 420. When the output $Q_i$ of the ith shift register stage goes high (and its complement,$nQ_i$ low), the corresponding switched capacitor amplifier is reset and its input capacitor is charged to the voltage present on the analog video input line. When $Q_i$ goes low again, the voltage present on the video line is amplified and becomes available at the amplifier output. Thus, by passing a single '1' through the shift register during one display line time, the serial video input is converted, by the end of that line time, to N separate voltages at the outputs of the amplifiers 400, where each voltage corresponds to the data for the pixel at one location across the display line. Before the next line begins, all N voltages are sampled and amplified by the second set of switched capacitor amplifiers 430 under the control of the clock signal $\phi$ and its complement n$\phi$, and become available at the outputs $V_{D1}$–$V_{DN}$, where they remain while the analog data for the subsequent line is being sampled by the first amplifiers 400.

Figure 14B:
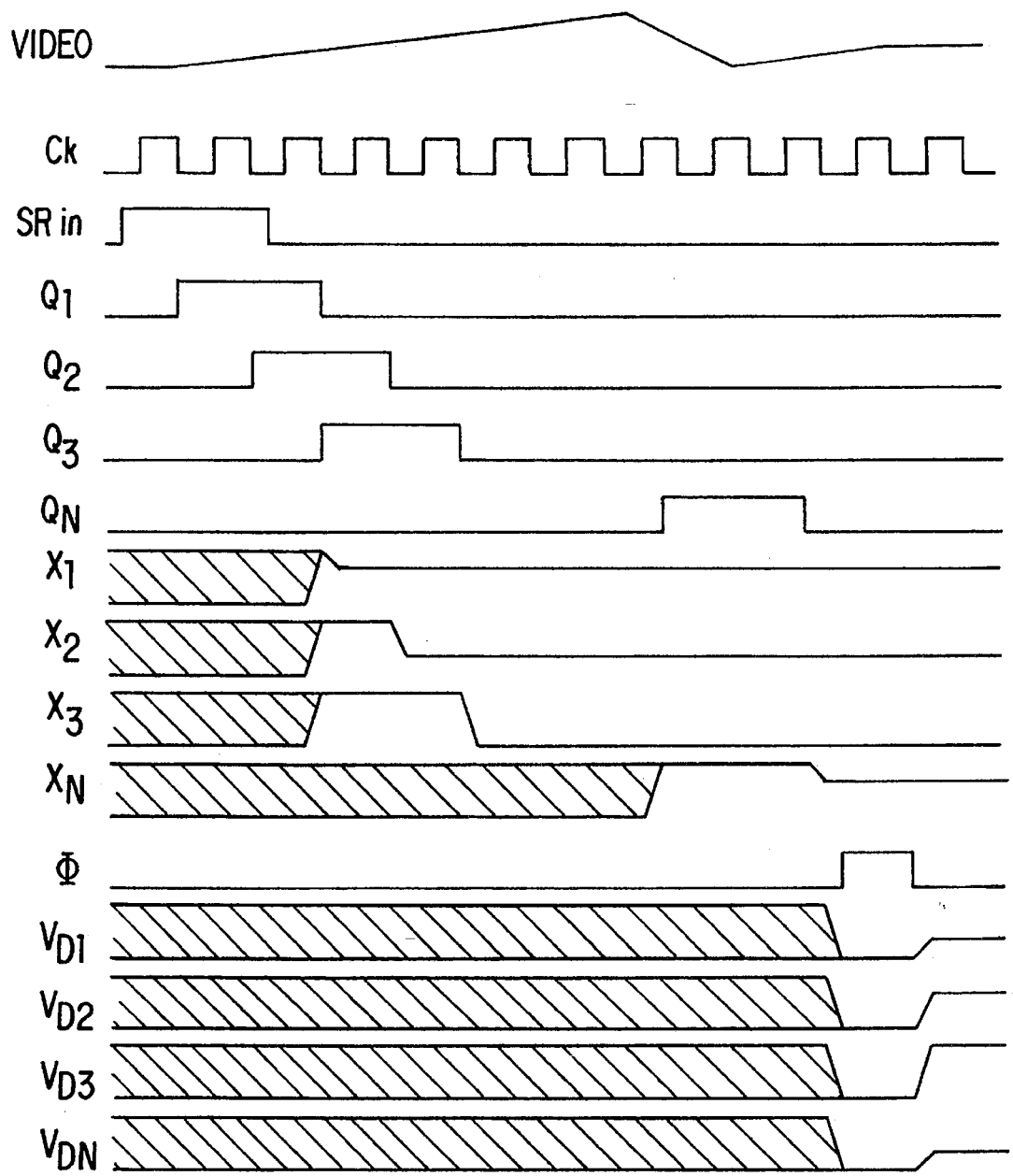
FIG. 14B shows the timing for the video signal sampling amplifier circuit of FIG. 14A.

The timing and control signals for the circuit shown in FIG. 14A are shown in FIG. 14B. In this case, a double '1' is passed through the shift register so that two outputs ($Q_1$ and $Q_2$, $Q_2$ and $Q_3$, $Q_3$ and $Q_4$ etc) are high simultaneously. This arrangement allows a longer time for the input capacitor of the first stage amplifiers 400 to charge to the video input signal.

The circuit shown in FIG. 14A and the timing scheme of FIG. 14B are for illustration only. Variations on the basic architecture which would achieve the same functionality will be apparent to persons skilled in the art.

Figure 15A:
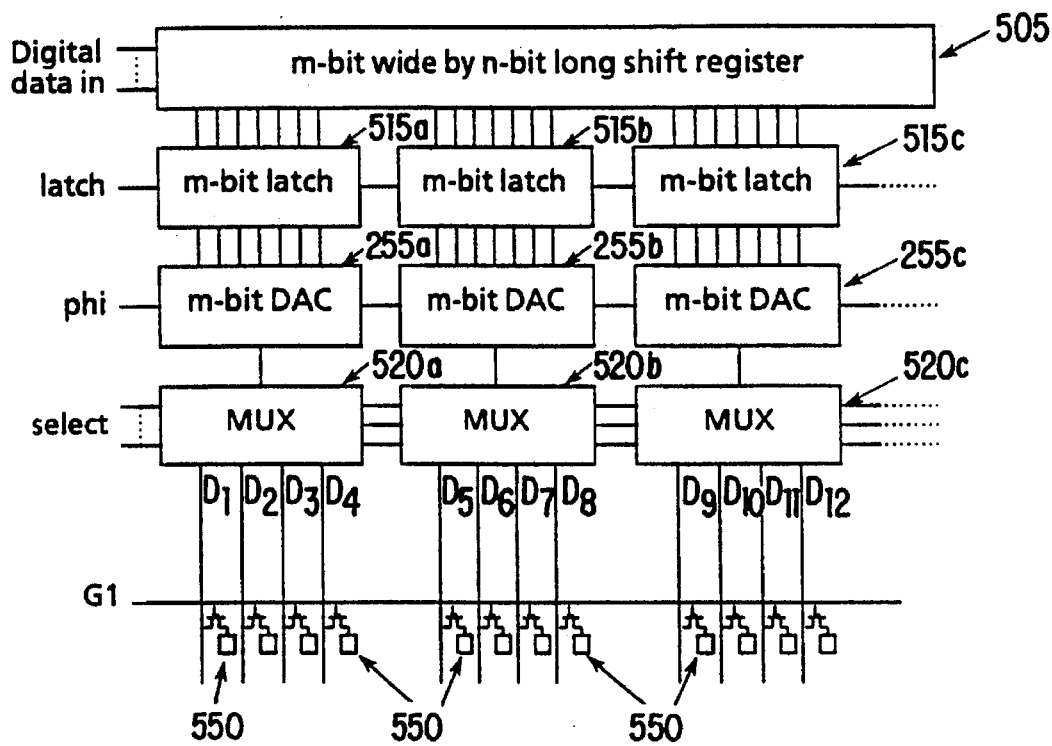
FIGS. 15A and 15B show a digital-to-analog converter display driver, and timing signals therefore.
Figure 15B:
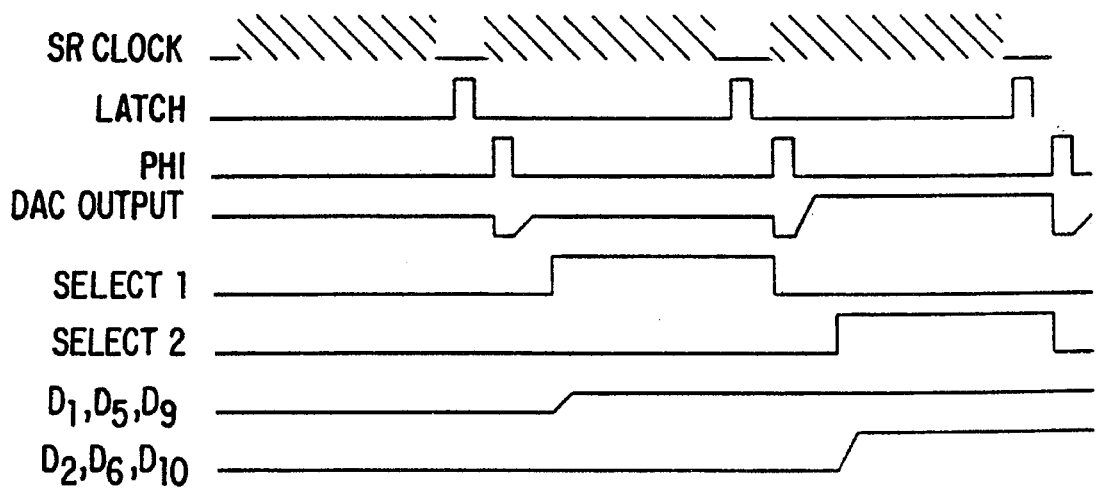

FIG. 15A shows a possible display driver architecture using DACs 255a–c, which could again be implemented entirely in polysilicon TFTs and TFCs. FIG. 15B shows a timing diagram for the FIG. 15A architecture. The input data is now digital reducing still further the amount of external processing (since in many applications the image source is digital). The data for a complete line is loaded serially into a shift register 505, and then transferred in parallel into a set of digital latches 515a–c. These drive the charge redistribution DACs 255a–c, which are controlled by a single clock, phi (and its complement) as indicated in FIG. 10. Thus all the serial input digital data is converted to analog form and made available simultaneously at the DAC outputs.

FIG. 15A also shows multiplexers at the output of each DAC. Since the DACs themselves are large, there may not be room to have one for each data line. The multiplexers allow each DAC to serve several lines (four in this example) by switching the DAC output between the data lines so that each is charged to the required voltage in turn. Such a scheme does, however, mean that the DAC conversion time must be smaller. The charge on each data line is then received by a corresponding liquid crystal light shutter 250 when a gate of a switch TFT associated therewith is switched on. The basic AMLCD actuation scheme is conventional. See, for example, the above-incorporated U.S. Pat. No. 4,872,002 to Stewart et al.

The arrangement of FIGS. 15A–B could also be used to control the LCDs in a printing bar as disclosed in the above incorporated U.S. Pat. No. 4,783,146 to Stephany et al. Alternatively, analog driver circuitry according to the present invention could be used to control electrographic or ionographic printing devices.

The polysilicon TFTs and TFCs can be formed on quartz or glass substrates using previously reported techniques (for example in the above incorporated paper by Wu et al entitled "Performance of Polysilicon TFT Digital Circuits Fabricated with Various Processing Techniques and Device Architectures", SID 90 Digest, pp. 307–310). The circuits described and tested herein were constructed on quartz substrates as follows. An active silicon layer was deposited and implanted with silicon to retard grain growth, resulting in a large grain size following the 600° C. crystallization anneal (see Wu et al, J. Appl. Phys., 65, pp. 4036–9 (1989)). Following island definition, the gate dielectric was formed by deposition of an LPCVD $SiO_2$ film and a 950° C. anneal in oxygen, resulting in a final gate oxide thickness of 100 nm. The gate material was a 350 nm thick LPCVD polysilicon film, doped by phosphorus ion implantation. The self-aligned source and drain regions were formed by boron and phosphorus ion implantation for the p-and n-channel devices respectively.

The process used to build the TFTs and TFCs required for the switched capacitor circuits described above is the same as that used to build the pixel TFTs and storage capacitors of and active matrix display. Thus no additional process steps are required to integrate the switched capacitor circuits with an AMLCD. All the circuits described were fabricated on quartz substrates using a maximum processing temperature well above the melting point of glass. Processes suitable for building TFTs on glass substrates are also well known, however, and could be used to fabricate switched capacitor circuits in the same way. The circuits could also be built in material on the periphery of an amorphous silicon TFT AMLCD which has been locally recrystallized by, for example, laser annealing.

While this invention has been described in conjunction with specific embodiments thereof, it is evident that many alternatives, modifications and variations will be apparent to those skilled in the art. For example, analog-to-digital converters and switched capacitor filters can also be fabricated. Accordingly, the preferred embodiments of the invention as set forth herein are intended to be illustrative, not limiting. Various changes may be made without departing from the spirit and scope of the invention as defined in the following claims.

What is claimed is:

1. An analog switched capacitor circuit comprising:
   at least one polysilicon thin film capacitor means;
   at least one polysilicon thin film transistor switch means;
   at least one polysilicon thin film amplifier means; and
   interconnection means for interconnecting the capacitor means, the transistor switch means, and the amplifier means so that the output of said circuit is set by the accumulation of electrical charge on said capacitor means under the control of said transistor switch means and said amplifier means;
   said capacitor means, said transistor switch means, said amplifier means, and said interconnection means all being formed on a common substrate.

2. The analog circuit of claim 1, wherein at least two said capacitor means are provided, and interconnected to said transistor switch means and said amplifier means by said interconnection means so that the output of said circuit is set by the accumulation and redistribution of charge among said capacitor means under the control of said transistor switch means and said amplifier means.

3. The analog circuit of claim 2, wherein an array of circuit elements driven by said analog circuit is integrally formed on said substrate.

4. The analog circuit of claim 3, wherein said array of circuit elements is a matrix of display devices, each of said display devices having a data line; and said analog circuit comprises:
   a plurality of analog switched capacitor subcircuits having at least one of said capacitor means, at least one of said transistor means, and at least one of said amplifier means, all being formed on said substrate, each of said subcircuits being operatively coupled to at least one of said data lines; and the transistor switch means for each of said subcircuits being separately controlled.

5. The circuit of claim 4, wherein each of said subcircuits is operatively coupled to a plurality of data lines, and said analog circuit further comprises multiplexing means connected between each of said subcircuits and its corresponding data lines, for selectively connecting each subcircuit to its corresponding data lines.

6. The analog circuit of claim 3, wherein said array of circuit elements comprises a plurality of switch controlled display elements connected to respective data lines, and said analog switched capacitor circuit is operatively coupled to at least one of said data lines.

7. The analog circuit of claim 6, wherein said analog circuit comprises a plurality of separate control circuits having at least one polysilicon thin film capacitor means, at least one polysilicon thin film transistor switch means, and at least one polysilicon thin film amplifier means electrically connected with at least one of said data lines, said transistor switch means of each of said separate control circuits being controlled by a separate control signal.

8. The analog circuit of claim 7, wherein each of said separate control circuits is operatively coupled to a plurality of different data lines, and said analog circuit further comprises multiplexing means connected between each of said control circuits and its corresponding data lines, for selectively connecting each control circuit to its corresponding data lines.

9. The analog circuit of claim 7, wherein each of said separate control circuits comprises a digital-to-analog converter.

10. The analog circuit of claim 7, wherein each of said separate control circuits comprises sample-and-hold means.

11. The analog circuit of claim 2, wherein said capacitor means, said transistor switch means, and said amplifier means are configured as a digital-to-analog converter.

12. The analog circuit of claim 2, wherein said capacitor means, said transistor switch means, and said amplifier means are configured as a sampling amplifier means.

13. The analog circuit of claim 3, wherein said circuit elements are printing elements.

14. An analog switched capacitor circuit comprising:
   an amplifier constructed from polysilicon thin film transistors and having an input and an output;
   a polysilicon thin film input capacitor having an output attached to said amplifier input;
   a first polysilicon thin film transistor attached to an input of said input capacitor, for selectively attaching said input capacitor to an input voltage source based upon a first control signal;
   a second polysilicon thin film transistor attached to said input of said input capacitor, for selectively attaching said input capacitor to ground based upon a second control signal;
   a polysilicon thin film feedback capacitor attached between said output and said input of said amplifier;
   a third thin film polysilicon transistor attached between said output and said input of said amplifier, for selectively discharging said feedback capacitor based upon one of said first and second control signals;
   wherein a capacitance of said input and said feedback capacitors is chosen, and said first, second and third transistors are controlled so that the output of said circuit is set by the transfer and distribution of charge among said input and feedback capacitors under the control of said first, second and third transistors; and
   said amplifier, said input and feedback capacitors, and said first, second and third transistors all being formed on a common substrate.

15. The analog circuit of claim 14, further comprising:

a fourth polysilicon thin film transistor attached between said input and said output of said amplifier, for selectively discharging said feedback capacitor in conjunction with said third transistor, based on an opposite one of said first and second control signals.

16. The analog circuit of claim 15, wherein said amplifier includes a plurality of transistors having gates attached to different voltage sources.

17. The analog circuit of claim 15, wherein said amplifier is a two stage amplifier including a compensating polysilicon thin film capacitor.

18. The analog circuit of claim 15, further comprising:

a plurality of said input capacitors, each having a different capacitance and a respective first and second thin film transistor, each of said first transistors being attachable to a common reference voltage source and being controlled by a different bit of a multi-bit digital input, so that each respective input capacitor is charged by the reference voltage based on its bit input, whereby said analog circuit is a digital-to-analog converter.

19. The analog circuit of claim 14, wherein an array of circuit elements driven by said analog circuit is integrally formed on said substrate.

20. The analog circuit of claim 14, wherein said array of circuit elements comprises a plurality of switch controlled display elements connected to respective data lines, and said analog switched capacitor circuit is operatively coupled to at least one of said data lines.

21. A method of fabricating an analog switched capacitor circuit comprising:

a) forming at least one polysilicon thin film capacitor means on a substrate;

b) forming at least one polysilicon thin film transistor switch means on said substrate;

c) forming at least one polysilicon thin film amplifier means on said substrate; and d) forming polysilicon thin film interconnection means on said substrate, said interconnection means for interconnecting said capacitor means, said transistor switch means, and said amplifier means so that the output of said circuit is set by the accumulation of charge on said at least one capacitor means under the control of said transistor switch means, wherein said capacitor means, said transistor switch means, and said amplifier means are formed during the same polysilicon deposition process.

22. The method of claim 21, wherein at least two said polysilicon thin film capacitor means are formed on said substrate, and are interconnected to said transistor switch means and said amplifier means by said interconnection means so that the output of said circuit is set by the transfer and distribution of charge among said capacitor means under the control of said transistor switch means and said amplifier means.

23. The method of claim 22, further comprising:

forming at least one polysilicon circuit element on said substrate during said deposition process, said circuit element being operatively attached to said analog switched capacitor circuit.

24. The method of claim 23, wherein said at least one circuit element is a liquid crystal display element.

25. The method of claim 23, wherein said circuit element is a printing element.

26. The method of claim 22, wherein said analog circuit is configured as a digital-to-analog converter.

27. The method of claim 22, wherein said analog circuit is configured as a sampling amplifier.

* * * * *